United States Patent
Goedl et al.

(10) Patent No.: US 6,830,873 B2
(45) Date of Patent: Dec. 14, 2004

(54) METHOD FOR ADJUSTING AND EXPPOSING THE SECOND LEVEL OF A PHASE-SHIFT MASK

(75) Inventors: Gernot Goedl, Ismaning (DE); Dirk Löffelmacher, Taufkirchen (DE)

(73) Assignee: Infineon Technologies AG, Munich (DE)

( * ) Notice: Subject to any disclaimer, the term of this patent is extended or adjusted under 35 U.S.C. 154(b) by 156 days.

(21) Appl. No.: 10/233,701

(22) Filed: Sep. 3, 2002

(65) Prior Publication Data

US 2003/0064299 A1 Apr. 3, 2003

(30) Foreign Application Priority Data

Aug. 31, 2001 (DE) .......................................... 101 42 592

(51) Int. Cl.⁷ .............................. G03C 5/00; G03F 9/00
(52) U.S. Cl. .............................. 430/296; 430/5; 430/30; 430/22; 430/318
(58) Field of Search .............................. 430/5, 22, 319, 430/318, 322, 323, 324, 296, 30

(56) References Cited

U.S. PATENT DOCUMENTS

| | | | |
|---|---|---|---|
| 4,871,919 A | | 10/1989 | Donohue et al. |
| 5,814,423 A | * | 9/1998 | Maruyama et al. ............ 430/5 |
| 6,180,291 B1 | * | 1/2001 | Bessy et al. ................... 430/5 |

FOREIGN PATENT DOCUMENTS

JP  2000 348 997 A  12/2000

* cited by examiner

*Primary Examiner*—Saleha R. Mohamedulla
(74) *Attorney, Agent, or Firm*—Laurence A. Greenberg; Werner H. Stemer; Ralph E. Locher

(57) ABSTRACT

A method for adjusting and exposing the second level of a phase-shift mask includes the steps of depositing a thin conductive layer over a photoresist layer only on the alignment structures and their surroundings, and covering the chip structures exposed in the first step in a suitable way by a covering for the purpose of depositing the thin conductive layer. Grounding the thin conductive layer means that no charging of the substrate takes place during alignment by an electron-beam writer.

8 Claims, 1 Drawing Sheet

METHOD FOR ADJUSTING AND EXPPOSING THE SECOND LEVEL OF A PHASE-SHIFT MASK

BACKGROUND OF THE INVENTION

FIELD OF THE INVENTION

The invention relates to a method of adjusting and exposing the second level of a multi-level phase-shift mask, in which structures at the second level are exposed following adjustment (alignment) to alignment marks of a layer of a substrate or semiconductor wafer located beneath.

A fundamental aspect in the exposure of the second level of a phase-shift mask is the correct alignment to the alignment marks. Scanning the mask/the reticle to find these alignment structures, using an electron beam, has hitherto not been possible because of the electrical charging of the substrate irradiated with charged particles.

Hitherto, the second level of a phase-shift mask has been exposed with a laser-beam writer. Finding the alignment structures or marks was, in such a case, likewise carried out optically using laser light. Such a method did not result in any charging.

However, it is desirable to use an electron-beam writer to expose the second level of a phase-shift mask because such an electron-beam writer has considerably higher overlay accuracy and considerably better structural resolution than the laser-beam writer.

SUMMARY OF THE INVENTION

It is accordingly an object of the invention to provide a method for adjusting and exposing the second level of a multi-level phase-shift mask that overcomes the hereinafore-mentioned disadvantages of the heretofore-known devices and methods of this general type and that adjusts and exposes the second level of a multi-level phase-shift mask by using an electron-beam writer.

With the foregoing and other objects in view, there is provided, in accordance with the invention, a method of adjusting and exposing a second level of a multi-level phase-shift mask, including the steps of exposing chip structures at the second level of a phase-shift mask following adjustment to alignment marks of a layer disposed beneath the second level, the layer selected from the group consisting of a substrate and a semiconductor wafer, by applying a photoresist layer for a second exposure over an entire area of the layer to be exposed by the second exposure, covering the chip structures in areas exposed in a preceding process with a covering layer, depositing a conductive layer over areas of the layer not covered by the covering layer and areas of the alignment marks, grounding the conductive layer and removing the covering layer, adjusting the alignment marks covered by the grounded conductive layer by scanning the marks with an electron-beam writer, the grounded conductive layer preventing the layer from being charged up by the electron-beam writer, and exposing the second level of the phase-shift mask with the electron-beam writer.

In accordance with another mode of the invention, the conductive layer is thinner than the photoresist layer, the layer, the chip structures, and/or the covering layer.

In accordance with a further mode of the invention, the deposition step is carried out by depositing a conductive layer over sections of areas immediately surrounding the alignment marks.

With the objects of the invention in view, there is also provided a method of adjusting and exposing a second level of a multi-level phase-shift mask on a layer selected from the group consisting of a substrate and a semiconductor wafer, chip structures at the second level above the layer being exposed following adjustment to alignment marks of the layer, including the steps of (A) applying a photoresist layer for a second exposure over an entire area of the layer to be exposed by the second exposure, (B) covering, with a covering layer, the chip structures in at least one area exposed in a preceding process, (C) depositing a conductive layer over sections of at least one area not covered by the covering layer, the alignment marks, and surroundings of the alignment marks, (D) grounding the conductive layer deposited in step and removing the covering layer, (E) adjusting by scanning the alignment marks covered by the grounded conductive layer by using an electron-beam writer, the grounded conductive layer preventing the layer from being charged up, and (F) exposing the second level of the phase-shift mask with the electron-beam writer.

In a method for providing a layer selected from the group consisting of a substrate and a semiconductor wafer, which includes exposing chip structures at a level above the layer following adjustment to alignment marks of the layer, with the objects of the invention in view, there is also provided a method of adjusting and exposing a second level of a multi-level phase-shift mask on the layer, including the steps of applying a photoresist layer for a second exposure over an entire area of the layer to be exposed by the second exposure, covering the chip structures in areas exposed in a preceding process with a covering layer, depositing a conductive layer over areas of the layer not covered by the covering layer and areas of the alignment marks, grounding the conductive layer and removing the covering layer, adjusting the alignment marks covered by the grounded conductive layer by scanning the marks with an electron-beam writer, the grounded conductive layer preventing the layer from being charged up by the electron-beam writer, and exposing the second level of the phase-shift mask with the electron-beam writer.

According to a significant aspect of the invention, the method is characterized by the following steps:

(A) applying a photoresist layer for the second exposure over the entire area of a wafer or substrate to be exposed by the second exposure;

(B) covering, with a covering layer, chip structures in the area that have been exposed in a preceding process;

(C) depositing a thin conductive layer over the sections of the area that are not covered by the covering layer and include the alignment marks and their surroundings;

(D) grounding the thin conductive layer deposited in step (C) and removing the covering layer;

(E) adjusting by scanning the alignment marks covered by the grounded thin conductive layer by using an electron-beam writer, the conductive grounded layer preventing the semiconductor substrate being charged up; and (F) exposing the second level of the phase-shift mask with the electron-beam writer.

By the specific local deposition of a thin conductive layer on the alignment structures and their surroundings and grounding these surroundings, it is made possible to carry out the adjustment and exposure of the second level of the phase-shift mask with an electron-beam writer without charging up the substrate.

The advantages of the method according to the invention include the higher overlay accuracy of the electron-beam writer and the considerably better structural resolution as compared with the laser-beam writer. Further, the same process flow can be assumed for the second exposure step as for the first step. This results in a substantial saving in operating media (such as chemicals), a reduction in the logistic outlay and a restriction in the erroneous influence of humans.

Other features that are considered as characteristic for the invention are set forth in the appended claims.

Although the invention is illustrated and described herein as embodied in a method for adjusting and exposing the second level of a phase-shift mask, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
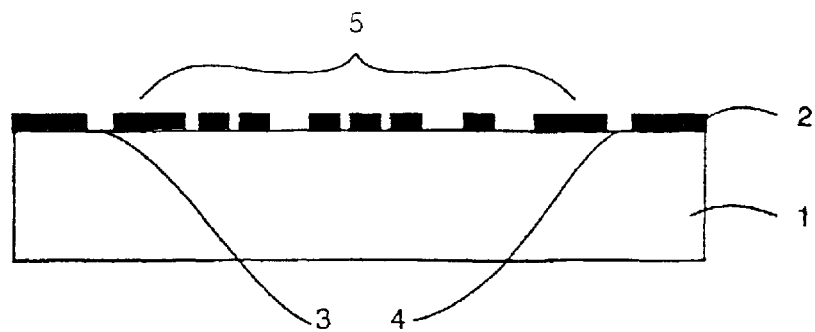
FIGS. 1 to 4 are fragmentary, cross-sectional views through a substrate or a semiconductor wafer of successive method steps in a method according to the invention.

Referring now to the figures of the drawings in detail and first, particularly to FIG. 1 thereof, there is shown, in the form of a schematic cross-section, a section of a substrate or semiconductor wafer 1, which has chip structures 5 and alignment marks 3, 4 in an area that is covered with chromium/MoSi 2.

Figure 2:
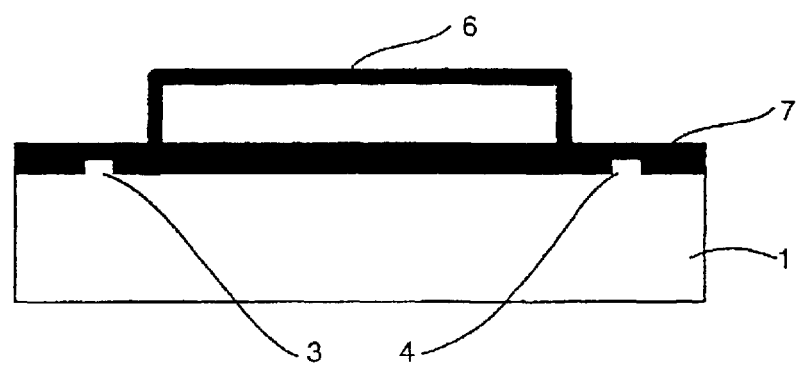

According to FIG. 2, which shows the same section as FIG. 1, a photoresist layer 7 for the second exposure is applied over the entire area, and the already exposed chip structures 5 are covered with a suitable covering layer 6.

Figure 3:
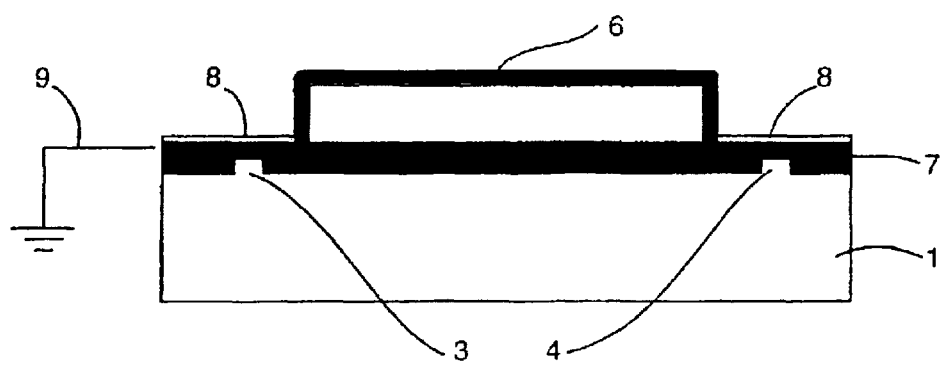
Figure 4:
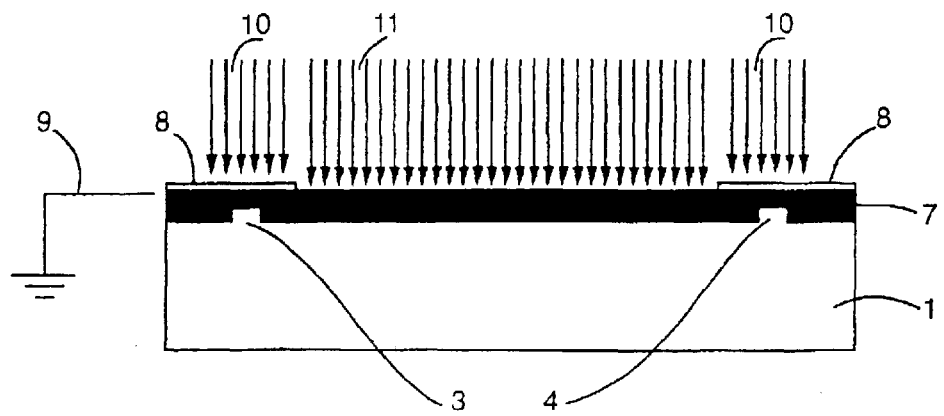

According to FIG. 3, a thin conductive layer 8 is then deposited over the areas that are not covered by the covering layer 6 and include the alignment marks 3, 4 and their surroundings. Grounding 9 the deposited thin conductive layer 8 permits adjustment (alignment) and the exposure of the second level of the phase-shift mask with an electron-beam writer because, as a result of the grounding 9, charging of the substrate by the electron beams is prevented. In FIG. 4, the covering layer 6 has been removed, and the number 10 illustrates the electron beam scanning the alignment marks. In such a case, the conductive grounded layer 8 prevents electrical charging of the substrate. In FIG. 4, the number 11 designates the exposure of the second level of the phase-shift mask with the electron-beam writer after alignment has been carried out.

According to the invention, therefore, the thin conductive layer 8 is deposited only on the alignment structures or marks 3, 4 and their surroundings. Such deposition is achieved by the chip structures 5 already exposed in the first exposure step being covered in a suitable way after the application of the photoresist layer 7 and before the deposition of the thin conductive layer 8. This means that only the alignment structures 3, 4 needed for the alignment (adjustment) are covered with the grounded conductive layer 8, and, as a result of the grounding, no charging of the substrate occurs when the alignment marks are scanned by a charged particle beam. Accordingly, the alignment or the adjustment and the exposure of the second level in a phase-shift mask is made possible with the same medium, namely, the electron-beam writer. As compared with the laser-beam writer, the electron-beam writer has considerably higher overlay accuracy and better structural resolution. Because the same process flow can be used for the second exposure step, operating media (such as chemicals) are saved to a great extent, the logistical outlay is reduced and the erroneous influence of humans is restricted.

We claim:

1. A method of adjusting and exposing a second level of a multi-level phase-shift mask, which comprises:
   exposing chip structures at the second level of a multi-level phase-shift mask following adjustment to alignment marks of a layer disposed beneath the second level, the layer selected from the group consisting of a substrate and a semiconductor wafer, by:
   applying a photoresist layer for a second exposure over an entire area of the layer to be exposed by the second exposure;
   covering the chip structures in areas exposed in a preceding process with a covering layer;
   depositing a conductive layer over:
      areas of the layer not covered by the covering layer; and
      areas of the alignment marks;
   grounding the conductive layer and removing the covering layer;
   adjusting the alignment marks covered by the grounded conductive layer by scanning the marks with an electron-beam writer, the grounded conductive layer preventing the layer from being charged up by the electron-beam writer; and
   exposing the second level of the multi-level phase-shift mask with the electron-beam writer.

2. The method according to claim 1, wherein the conductive layer is thinner than the photoresist layer.

3. The method according to claim 1, wherein the conductive layer is thinner than the layer.

4. The method according to claim 1, wherein the conductive layer is thinner than the chip structures.

5. The method according to claim 1, wherein the conductive layer is thinner than the covering layer.

6. The method according to claim 1, which further comprises carrying out the deposition step by depositing a conductive layer over sections of areas immediately surrounding the alignment marks.

7. A method of adjusting and exposing a second level of a multi-level phase-shift mask on a layer selected from the group consisting of a substrate and a semiconductor wafer, chip structures at the second level above the layer being exposed following adjustment to alignment marks of the layer, which comprises:
   A) applying a photoresist layer for a second exposure over an entire area of the layer to be exposed by the second exposure;
   B) covering, with a covering layer, the chip structures in at least one area exposed in a preceding process;
   C) depositing a conductive layer over:
      sections of at least one area not covered by the covering layer;
      the alignment marks; and
      surroundings of the alignment marks;
   D) grounding the conductive layer deposited in step C) and removing the covering layer;
   E) adjusting by scanning the alignment marks covered by the grounded conductive layer by using an electron-beam writer, the grounded conductive layer preventing the layer from being charged up; and F) exposing the second level of the multi-level phase-shift mask with the electron-beam writer.

8. In a method for providing a layer selected from the group consisting of a substrate and a semiconductor wafer, which includes exposing chip structures at a level above the layer following adjustment to alignment marks of the layer, a method of adjusting and exposing a second level of a multi-level phase-shift mask on the layer, which comprises:

applying a photoresist layer for a second exposure over an entire area of the layer to be exposed by the second exposure;

covering the chip structures in areas exposed in a preceding process with a covering layer;

depositing a conductive layer over:
areas of the layer not covered by the covering layer; and
areas of the alignment marks;

grounding the conductive layer and removing the covering layer;

adjusting the alignment marks covered by the grounded conductive layer by scanning the marks with an electron-beam writer, the grounded conductive layer preventing the layer from being charged up by the electron-beam writer; and exposing the second level of the multi-level phase-shift mask with the electron-beam writer.

* * * * *